(12) United States Patent
Yang et al.

(10) Patent No.: US 12,312,520 B2
(45) Date of Patent: May 27, 2025

(54) RARE EARTH OXIDE NANOSHEET COMPOSITE MODIFIED BY ORGANIC LIGAND, PREPARATION METHOD AND OLED LUMINESCENT FILM

(71) Applicants: Shanghai Alpha Lighting Equipment Testing Ltd. (SALT), Shanghai (CN); China National Lighting Fitting Quality Inspection and Testing Centre (CLTC), Shanghai (CN); National Center of Inspection and Testing on Electric Light Source Quality (Shanghai), Shanghai (CN)

(72) Inventors: Wei Yang, Shanghai (CN); Zaidao Yu, Shanghai (CN); Lili Jiang, Shanghai (CN); Yue Yang, Shanghai (CN); Chaozhong Chen, Shanghai (CN)

(73) Assignees: Shanghai Alpha Lighting Equipment Testing Ltd. (SALT), Shanghai (CN); China National Lighting Fitting Quality Inspection and Testing Centre (CLTC), Shanghai (CN); National Center of Inspection and Testing on Electric Light Source Quality (Shanghai), Shanghai (CN)

( * ) Notice: Subject to any disclaimer, the term of this patent is extended or adjusted under 35 U.S.C. 154(b) by 229 days.

(21) Appl. No.: 17/890,309

(22) Filed: Aug. 18, 2022

(65) Prior Publication Data
US 2023/0083729 A1  Mar. 16, 2023

(30) Foreign Application Priority Data
Sep. 15, 2021  (CN) .......................... 202111079948.7

(51) Int. Cl.
*C09K 11/02*  (2006.01)
*C01F 17/241*  (2020.01)
(Continued)

(52) U.S. Cl.
CPC .......... *C09K 11/025* (2013.01); *C01F 17/241* (2020.01); *C09K 11/7769* (2013.01);
(Continued)

(58) Field of Classification Search
CPC ............ C09K 11/7787; C09K 11/7769; C09K 11/025; C01F 17/253; C01F 17/224;
(Continued)

(56) References Cited

U.S. PATENT DOCUMENTS 9,051,427 B2 *  6/2015  Hasegawa .............. C08G 79/04

FOREIGN PATENT DOCUMENTS

CN  104045104 A  9/2014

OTHER PUBLICATIONS

Weil Yang; East China Normal University; "Research and Application of Fluorescence Probes and Sensors Based on Rare Earth Complexes and Their Nanosheets"; May 2018; 160 Pgs, with English abstract.

* cited by examiner

*Primary Examiner* — Monica A Huson
(74) *Attorney, Agent, or Firm* — Cooper Legal Group, LLC

(57) ABSTRACT

The present application relates to a technical filed of energy sources and illumination, and discloses a rare earth oxide nanosheet composite modified by an organic ligand, a preparation method and an organic light-emitting diode (OLED) luminescent film. The rare earth oxide nanosheet composite modified by the organic ligand is obtained by adding the organic ligand in the rare earth nanosheet sol for ultrasonic (Continued)

coordination; and a mole ratio of the rare earth nanosheet sol to the organic ligand is 1:(3-9).

12 Claims, 5 Drawing Sheets

(51) Int. Cl.
C09K 11/77 (2006.01)
H10K 85/30 (2023.01)
H10K 50/115 (2023.01)

(52) U.S. Cl.
CPC ........ *C09K 11/7787* (2013.01); *H10K 85/341* (2023.02); *H10K 85/351* (2023.02); *H10K 85/361* (2023.02); *C01P 2004/03* (2013.01); *C01P 2004/24* (2013.01); *C01P 2006/40* (2013.01); *H10K 50/115* (2023.02)

(58) Field of Classification Search
CPC .. C01F 17/241; H10K 85/351; H10K 85/361; H10K 85/341; H10K 50/115; C01P 2006/40; C01P 2004/03; C01P 2002/54; C01P 2004/24

See application file for complete search history.

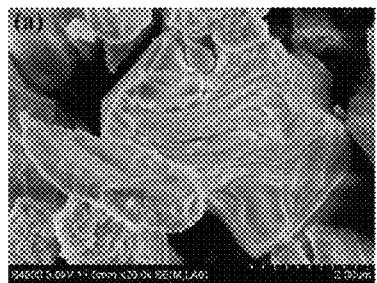 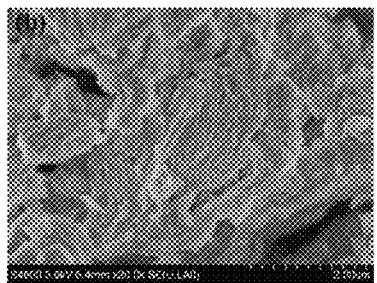 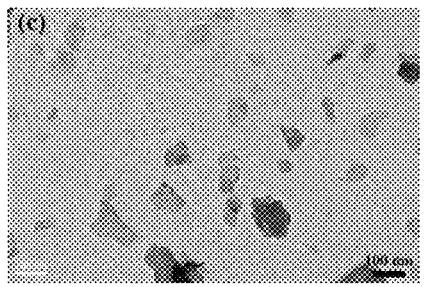
FIG. 2A     FIG. 2B     FIG. 2C
FIG. 3

RARE EARTH OXIDE NANOSHEET COMPOSITE MODIFIED BY ORGANIC LIGAND, PREPARATION METHOD AND OLED LUMINESCENT FILM

CROSS-REFERENCE TO RELATED APPLICATION

This application claims the priority to Chinese patent application serial no. 202111079948.7, filed on Sep. 15, 2021. The entirety of Chinese patent application serial no. 202111079948.7 is hereby incorporated by reference herein and made a part of this specification.

TECHNICAL FIELD

The present application relates to a technical filed of energy sources and illumination, and, in particular to a rare earth oxide nanosheet composite modified by an organic ligand, a preparation method and an organic light-emitting diode (OLED) luminescent film.

BACKGROUND ART

An OLED is a self luminescent material, which has advantages of large luminescent angle range, low energy consumption, low cost and no toxic substances during production process. It has a potential to replace traditional illumination system. Its luminescence principle is that under an action of external voltage, an hole is injected to an hole transport layer from a positive pole, and an electron is injected into an electron transport layer from a negative pole. An exciton is formed when the hole and the electron meet at an organic light-emitting layer, which, being unstable in an excited state, is subjected to radiative transition to a ground state, by which energy difference is generated and released in a form of light.

At present, although OLED has more excellent luminescent performance than LED, it has non-negligible disadvantages. Its colour purity is not enough, so that it is difficult to show a bright and rich colour, and at the same time, a conventional organic light-emitting complex is prone to photobleaching, resulting in a much lower luminescent life than that of LED. Therefore, OLED is still has great space for improvement in terms of material.

SUMMARY

In order to obtain an excellent colour purity and a service life, the present application provides a rare earth oxide nanosheet composite modified by an organic ligand, a preparation method and an OLED luminescent film.

In a first aspect, the present application provides the preparation method of the rare earth oxide nanosheet composite modified by the organic ligand, which adopts the following technical solutions.

The preparation method of the rare earth oxide nanosheet composite modified by organic ligand includes steps as follows: adding an organic ligand into a rare earth oxide nanosheet sol for ultrasonic coordination, and ultrasonically processing at 40-60% of a rated power for 20-40 min to obtain the rare earth oxide nanosheet composite modified by organic ligand; wherein, a mole ratio of the rare earth oxide nanosheet sol to the organic ligand is 1:(3-9).

In the above technical solution, organic coordination is performed to the rare earth oxide nanosheet sol. Because the organic ligand has a wide and strong absorption band in a near ultraviolet region, its third-order state energy level is well matched with a lowest excited state energy level of a rare earth luminescent center. Under this circumstance, by controlling the mole ratio of the rare earth oxide nanosheet sols to the organic ligands, the rare earth oxide nanosheet sols can be modified by the organic ligands under ultrasonic action. Compared with a rare earth complex, the present application involves in low preparation cost and simple process, while can prepare a rare earth oxide nanosheet composite modified by organic ligand which is not prone to aggregate and luminescence quenching and can achieve efficient utilization of a rare earth atom. Therefore, the obtained rare earth oxide nanosheet composite modified by organic ligand has more excellent colour purity and luminescent life.

Preferably, the organic ligand is one selected from a group consisting of potassium (3,5-dimethylpyrazolyl) borate, α-thiophene acetylacetone and 2-thenoyltrifluoroacetone.

Preferably, the preparation method of the rare earth oxide nanosheet sol comprises:
1) grinding the rare earth oxide and a bromide, and calcining at a temperature of 700-1000° C. for 12-24 h to obtain a rare earth bromide;
2) conducting microwave intercalation treatment to the rare earth bromide by using an intercalation agent to obtain a rare earth oxide intercalation intermediate;
3) dispersing the rare earth oxide intercalation intermediate into an organic solvent for stripping to obtain a rare earth nanosheet;
4) centrifugally separating the rare earth oxide intercalation intermediate after being stripped, taking supernatant to obtain a rare earth nanosheet sol.

Preferably, in step 1), the bromide is potassium bromide and/or ammonium bromide.

Preferably, the bromide is further selected as potassium bromide.

Preferably, the rare earth oxide comprises at least two selected from a group consisting of yttrium metal oxide, europium metal oxide, terbium metal oxide, cerium metal oxide and gadolinium metal oxide.

Preferably, in step 1), a mass ratio of the rare earth oxide to the bromide is 1:(2-3).

Preferably, the method for grinding is selected as ball grinding.

Preferably, in step 2), the microwave intercalation includes dispersing the bromide in the organic solvent, adding the intercalation agent, and performing microwave heating at a power of 700-800 w for 2-5 min, cooling under stirring, filtering, washing for several times with deionized water, and drying for 12-24 h at the temperature of 60-100° C. to obtain the rare earth oxide intercalation intermediate.

Preferably, the intercalation agent comprises sodium benzoate and/or sodium dodecyl benzene sulfonate.

Preferably, the organic solvent is one or more selected from a group consisting of 1-butanol, ethanol and water.

Preferably, in step 3), the method of stripping comprises ultrasonically stripping and/or ball-mill stripping.

Preferably, in step 3), ultrasonic power adopting by the ultrasonically stripping method is 1000-1500 w, and ultrasonic time is 20-40 min.

By adopting the above technical solution, the preparation method is simple and environment-friendly. A rare earth oxide nanosheet sol band with positive charges is obtained. A microwave method is used during the intercalation (ion exchange) process, which greatly saves time.

In a second aspect, the present application provides the rare earth oxide nanosheet composite modified by the organic ligand, which adopts the following technical solutions.

The rare earth oxide nanosheet composite modified by the organic ligand is obtained by adopting the preparation method of the rare earth oxide nanosheet composite modified by the organic ligand; in which the rare earth oxide nanosheet composite modified by organic ligand has the positive charges.

Preferably, the rare earth oxide nanosheet composite modified by organic ligand includes a host element and a guest element; the host element is at least one selected from a group consisting of the yttrium element (Y) and gadolinium element (Gd), and the guest element is selected from at least one selected from a group consisting of europium element (Eu), terbium element (Tb) and cerium element (Ce); the mole ratio of the host element to the guest element is (19-99):1.

Preferably, length of the rare earth oxide nanosheet composite modified by organic ligand has a length of 10-500 nm, a width of 10-500 nm, and a thickness of 0.8-9 nm.

By adopting the above technical solution, it is not only can hold the excellent colour purity of the rare earth luminescent center, but also can reduce the problem of prone to dissolution, aggregate and quenching etc. of the organic complex in the organic solvent; and further, the problem of photobleaching is addressed.

In a third aspect, the present application provides the OLED luminescent film, which adopts the following technical solutions.

The preparation method of the OLED luminescent film includes that the rare earth oxide nanosheet composite modified by the organic ligand is conducted with means of layer by layer self-assembling, electroplating, spin coating or pulling etc. to form the film on a base plate to obtain the OLED luminescent film.

By adopting the above technical solution, by utilizing that the rare earth oxide nanosheet composite modified by organic ligand has the positive charges, the OLED luminescent film can be prepared by multiple assembly methods such as layer by layer self-assembly, electroplating, spin coating or pulling etc., and the colour purity and life of the OLED are improved.

Preferably, the preparation method of the OLED luminescent film also includes that the OLED luminescent film is encapsulated in a protective atmosphere.

Preferably, the protective atmosphere is inert gas atmosphere.

Preferably, inert gas in the inert gas atmosphere is one of argon (Ar), helium (He), neon (Ne), krypton (Kr) and xenon (Xe).

By adopting the above technical solution, by utilizing the character that the rare earth oxide nanosheet composite modified by organic ligand has the positive charges, after OLED is encapsulated in the inert gas atmosphere by electroplating, it can effectively avoids the falling off phenomenon during an experimental process.

In a fourth aspect, the present application provides a OLED device, which adopts the following technical solutions.

The OLED device includes the OLED luminescent film.

In a fifth aspect, the present application provides use of the rare earth oxide nanosheet composite modified by the organic ligand in the preparation of the OLED luminescent film.

In summary, the present application has the beneficial effects as follow.

1. The present application is not only can keep the excellent colour purity of the rare earth luminescent center, but also can reduce the problem of prone to dissolution, aggregate and quenching etc. of the organic complex in the organic solvent; and further, the problem of photobleaching is addressed.

2. The present application has advantages of low preparation cost, simple operation and time saving. An OLED luminescent film of the rare earth oxide nanosheet composite modified by organic ligand can be obtained by electroplating.

3. By adopting a rare earth oxide nanosheet composite modified by organic ligand and having positive charges, electroplating and encapsulating OLED under inert gas atmosphere, the falling off phenomenon during an experimental process can be effectively avoided in the present application.

4. The OLED luminescent film prepared by the rare earth oxide nanosheet composite modified by organic ligand obtained in the present application is different from a powder luminescent film prepared by other technologies. In addition, the preparation method of the OLED luminescent film in the present application can be applied to OLEDs with different morphologies as well as flexible OLEDs without the need of adding an additional curing agent, thus having a wide application.

5. The rare earth oxide nanosheet composite modified by organic ligand obtained in the present application can effectively promote a study of the OLEDs with different light effects by regulating types of the rare earth elements and types of the organic ligands.

BRIEF DESCRIPTION OF THE DRAWINGS

FIGS. 2A-2C are SEM images of a rare earth ($Y_{19}$(Eu)) oxide, rare earth ($Y_{19}$(Eu)) intercalation intermediate and rare earth ($Y_{19}$(Eu)) oxide nanosheet in Example a of the present application, respectively. In particular, FIG. 2A is the SEM image of rare earth ($Y_{19}$(Eu)) bromide;

FIG. 2B is the SEM image of the rare earth ($Y_{19}$(Eu)) intercalation intermediate; FIG. 2C is the SEM image of the rare earth ($Y_{19}$(Eu)) oxide nanosheet.

FIG. 3 is a sol image of rare earth ($Y_{19}$(Eu)) oxide nanosheet composite in Example a in the present application.

FIGS. 8A and 8B are the schematic diagram of luminescent performance of europium oxide nanosheet solution in Example 1 and europium complex solution in comparative example 1 under an ultraviolet lamp in the present application, in which FIG. 8A is europium oxide nanosheet solution, and FIG. 8B is europium complex solution.

DETAILED DESCRIPTION

The present application is further described in detail below in combination with FIGS. 1-8 and examples.

Raw materials used in all examples of the present application, unless otherwise specified, others are commercially available product.

Figure 1:
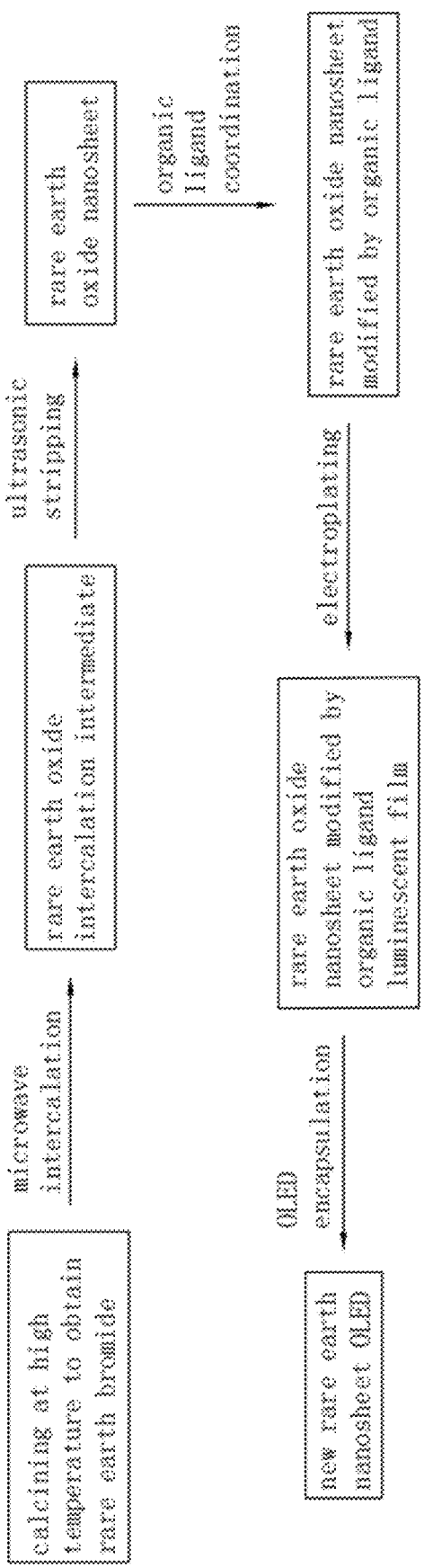
FIG. 1 is a schematic diagram of a preparation process of an OLED luminescent film in one typical embodiment of the present application.

Examples a-d: A Rare Earth Oxide Nanosheet Composite Modified by an Organic Ligand Example a The rare earth oxide nanosheet composite modified by the organic ligand, as shown in FIG. 1, included steps as follows.

1) The rare earth oxide containing yttrium and europium was obtained by mixing yttrium metal oxide and europium metal oxide by a mole ratio of 19:1; then mixed and milled with potassium bromide for 2 hours by a mole ratio of 1:2, and calcined at a temperature of 700° C. for 12 h to obtain rare earth ($Y_{19}$(Eu)) bromide blocky product.

2) Obtained rare earth ($Y_{19}$(Eu)) bromide blocky product (0.1 mg) was added into 500 mL deionized water. Then 1.4 mg sodium benzoate was added as an intercalation agent, and heated by microwave at 800 w for 2 min, and cooled and stirred for 20 times, and filtered and washed with deionized water for 3 times, and dried at a temperature of 100° C. for 12 h to obtain rare earth ($Y_{19}$(Eu)) oxide intercalation intermediate.

3) Obtained rare earth ($Y_{19}$(Eu)) oxide intercalation intermediate after drying in step 2) was dispersed into 1-butanol, and ultrasonically processed at power of 1200 W for 20 min to obtain rare earth ($Y_{19}$(Eu)) oxide nanosheet (referring to FIGS. 2A-2C).

4) Obtained rare earth ($Y_{19}$(Eu)) oxide nanosheet after being ultrasonically stripped in step 3) was centrifugally separated, and supernatant was taken, as shown in FIG. 3 to obtain rare earth ($Y_{19}$(Eu)) oxide nanosheet sol.

5) Organic ligand (2-thenoyltrifluoroacetone) and rare earth ($Y_{19}$(Eu)) oxide nanosheet sol are mixed by the mole ratio of 3:1, and ultrasonically processed at 40% of rated power for 40 min, and ultrasonically coordinated to obtain rare earth ($Y_{19}$(Eu)) oxide nanosheet composite modified by the organic ligand.

Example b

The rare earth oxide nanosheet composite modified by the organic ligand, as shown in FIG. 1, included steps as follows.

1) The rare earth oxide containing yttrium and terbium was obtained by mixing yttrium metal oxide and terbium metal oxide by the mole ratio of 99:1; and then the rare earth oxide containing yttrium and terbium was mixed and ground with ammonium bromide for 2 h by the mole ratio of 1:2, and calcined at the temperature of 900° C. for 12 h in a muffle furnace to obtain rare earth ($Y_{99}(Tb)_1$) bromide blocky product.

2) Obtained rare earth ($Y_{99}(Tb)_1$) bromide blocky product (0.1 mg) was added into 400 mL deionized water. Then 1.4 mg sodium benzoate was added as the intercalation agent, and heated by microwave at 700 w for 5 min, and cooled and stirred for 20 times, and filtered and washed with deionized water for 4 times, and dried at the temperature of 60° C. for 24 h.

3) Obtained rare earth ($Y_{99}$(Tb)) oxide intercalation intermediate after drying in step 2) was added into ethanol, and ultrasonically processed at the power of 1200 W for 30 min to obtain rare earth ($Y_{99}$(Tb)) oxide nanosheet.

4) Obtained rare earth ($Y_{99}$(Tb)) oxide nanosheet after being ultrasonically stripped in step 3) was centrifugally separated, and supernatant was taken to obtain rare earth ($Y_{99}$(Tb)) oxide nanosheet sol.

5) Organic ligand (2-thenoyltrifluoroacetone) and the rare earth ($Y_{99}(Tb)_1$) oxide nanosheet sol are mixed by the mole ratio of 6:1, and ultrasonically processed at 40% of rated power for 20 min, and ultrasonically coordinated to obtain rare earth ($Y_{99}(Tb)_1$) oxide nanosheet composite modified by the organic ligand.

Example c

The rare earth oxide nanosheet composite modified by the organic ligand, as shown in FIG. 1, included steps as follows.

1) The rare earth oxide containing cerium and gadolinium was obtained by mixing cerium metal oxide and gadolinium metal oxide by the mole ratio of 20:1; and then the rare earth oxide containing cerium and gadolinium was mixed and ball milled with potassium bromide for 2 h by the mole ratio of 1:3, and calcined at the temperature of 1000° C. for 24 h in a tube furnace to obtain the rare earth ($Gd_{20}$(Ce)) bromide blocky product.

2) Obtained rare earth ($Gd_{20}$(Ce)) bromide blocky product (0.2 mg) was added into 200 mL deionized water. Then 2.4 mg sodium benzoate was added as the intercalation agent, and heated by microwave at 750 w for 3 min, and cooled and stirred for 20 times, and filtered and washed with deionized water for 3 times, and dried at the temperature of 80° C. for 20 h.

3) Obtained rare earth ($Gd_{20}$(Ce)) oxide intercalation intermediate after drying in step 2) was added into ethanol, and ultrasonically processed at the power of 1200 W for 40 min to obtain rare earth ($Gd_{20}$(Ce)) oxide nanosheet.

4) Obtained rare earth ($Gd_{20}$(Ce)) oxide nanosheet after being ultrasonically stripped in step 3) was centrifugally separated, and supernatant was taken to obtain rare earth ($Gd_{20}$(Ce)) oxide nanosheet sol.

5) Organic ligand (α-thiophene acetylacetone) and rare earth ($Gd_{20}$(Ce)) oxide nanosheet sol are mixed by the mole ratio of 9:1, and ultrasonically processed at 60% of rated power for 40 min, and ultrasonically coordinated to obtain rare earth ($Gd_{20}$(Ce)) oxide nanosheet composites modified by the organic ligand.

Example d

The rare earth oxide nanosheet composite modified by the organic ligand differs from the example b in: in step 3), a ball grinding method was used for intercalation instead of ultrasonic stripping. In particular, a ball grinding rate was 600 rpm/min, ball grinding time was 2 h.

Examples 1-4: OLED Luminescent Film

Example 1

The OLED luminescent film included steps as follows.

Rare earth ($Y_{19}(Eu)$) oxide nanosheet composite modified by organic ligand (2-thenoyltrifluoroacetone) prepared in Example a was used to prepare the rare earth oxide nanosheet OLED luminescent film modified by the organic ligand (hereby abbreviated as OLED luminescent film) by electroplating.

Example 2

The OLED luminescent film included steps as follows.

Figure 4:
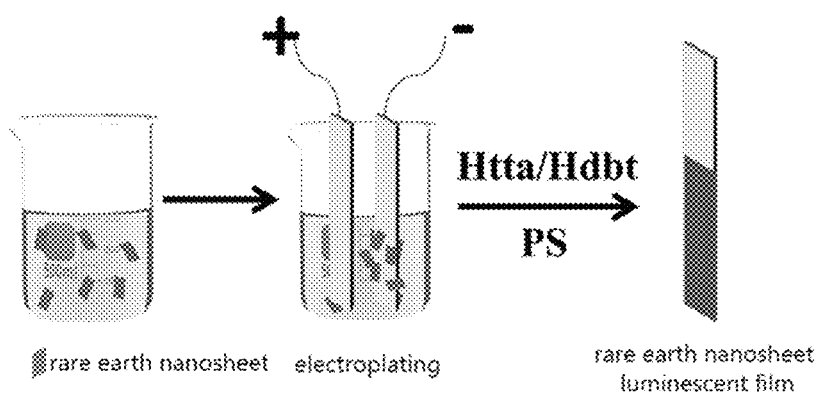
FIG. 4 is the schematic diagram of the preparation of the OLED luminescent film by using rare earth ($Y_{99}(Tb)_1$) oxide nanosheet composite in Example 2 of the present application.

Rare earth ($Y_{99}(Tb)_1$) oxide nanosheet composite modified by organic ligand (2-thenoyltrifluoroacetone) prepared in Example b was used to prepare the OLED luminescent film by electroplating, referring to FIG. 4.

Example 3

The OLED luminescent film included steps as follows.

Rare earth ($Gd_{20}(Ce)$) oxide nanosheet composite modified by organic ligand (α-thiophene acetylacetone) prepared in Example c was used to prepare the OLED luminescent film by layer by layer self-assembly.

Example 4

The OLED luminescent film included steps as follows.

Rare earth ($Gd_{20}(Ce)$) oxide nanosheet composite modified by organic ligand (α-thiophene acetylacetone) prepared in Example c was used to prepare the OLED luminescent film by spin coating.

Example 5

The OLED luminescent film differs from example 1 in: based on the OLED luminescent film prepared in Example 1, the preparation method also included encapsulating the OLED luminescent film was under inert gas (such as argon).

Example 6

The OLED luminescent film differs from example 2 in: terbium TB oxide nanosheet coordinated with 2-thenoyltrifluoroacetone ($Tb(TTA)_3$) was used.

Application Examples 1-2: OLED Device

Application Example 1

Figure 5:
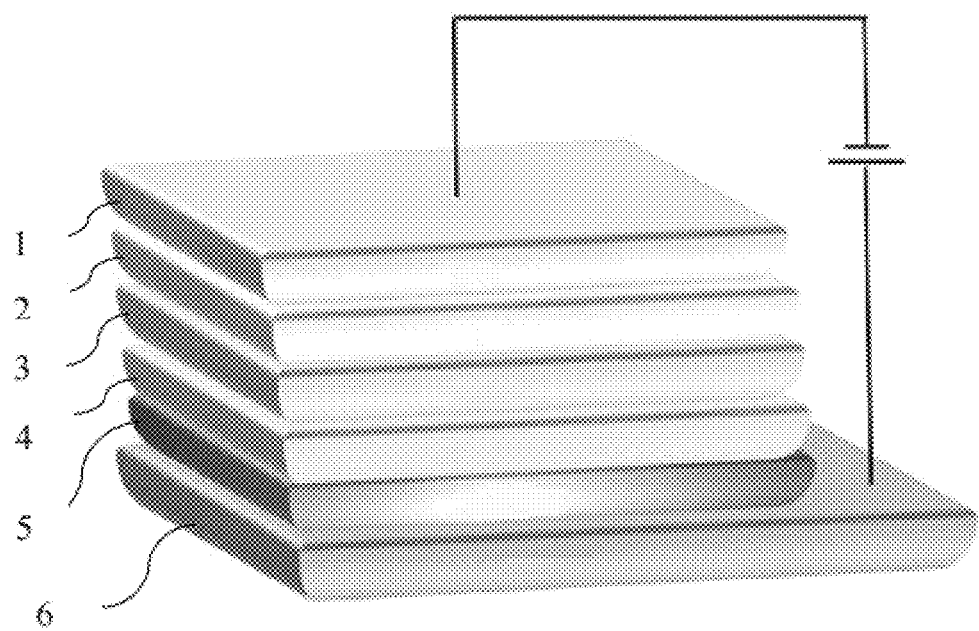
FIG. 5 is the diagram of the application of rare earth ($Gd_{20}$(Ce)) oxide nanosheet composite obtained in Example 3 of the present application in the OLED.

The OLED device, referring to FIG. 5, the rare earth nanosheet (i.e. OLED) successively consisted of an Al layer 1, a LIF layer 2, a TPBI layer 3, an OLED luminescent film layer 4, a PEDOT layer 5 and an ITO layer 6 from a negative pole to a positive pole. In particular, the OLED luminescent film layer 4 used the OLED luminescent film obtained in Example 2.

Application Example 2

The OLED device differs from the application example 1 in: the OLED luminescent film layer used the OLED luminescent film obtained in Example 5.

COMPARATIVE EXAMPLES

Comparative Example 1

The OLED luminescent film differs from Example 1 in: the organic ligand was different. The europium complex was used to prepare the OLED luminescent film instead of rare earth ($Y_{19}(Eu)$) oxide nanosheet composite modified by organic ligand (2-thenoyltrifluoroacetone).

In particular, the preparation method of the europium complex included: 1 mg europium nitrate was dissolved in 100 mL deionized water, and organic ligand 2-thenoyltrifluoroacetone was added by the mole ratio of 1:3, and dilute ammonia water was added for adjusting pH to 6-7 to obtain the europium complex.

Comparative Example 2

The OLED luminescent film differs from Example 2 in: rare earth ($Y_{99}(Tb)_1$) oxide nanosheet sol was used to prepare the OLED luminescent film instead of rare earth ($Y_{99}(Tb)_1$) oxide nanosheet composite modified by organic ligand (2-thenoyltrifluoroacetone TTA).

Performance Test and Analysis

Test One: Test of Fluorescence Intensity

Figure 6:
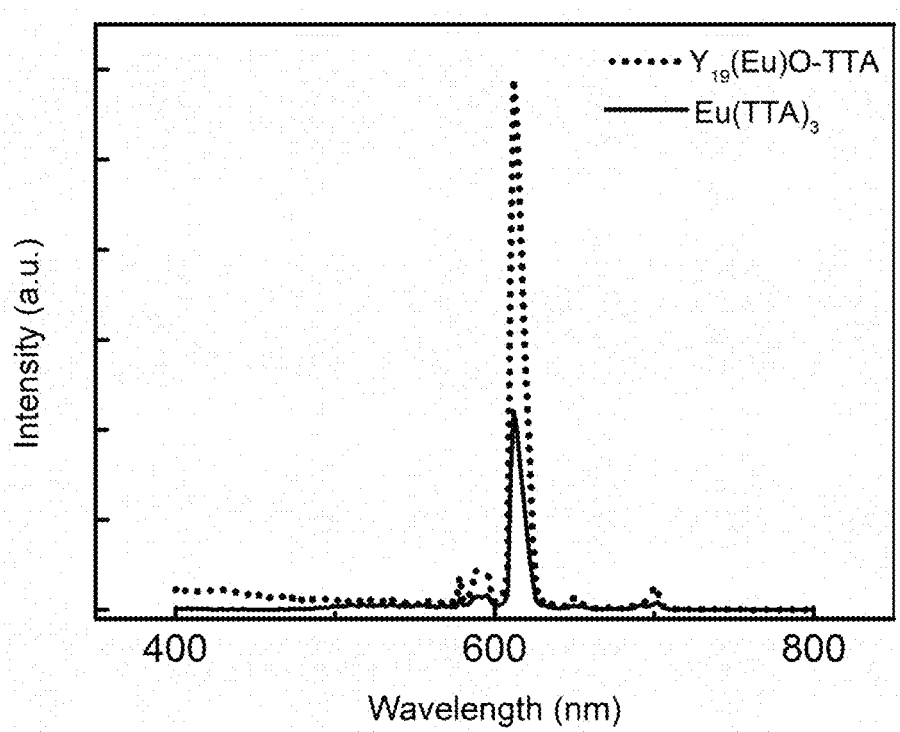
FIG. 6 is a fluorescence spectrum comparison diagram of Example 1 in the present application and comparative Example 1.

Test objects: the OLED luminescent film of Example 1 was used as test sample 1; the OLED luminescent film of Comparative example 1 was used as comparative sample 1;

Test method: fluorescence properties of Example 1 and Comparative example 1 were separately tested by using a fluorescence spectrophotometer, and recorded in FIG. 6.

In combination with Example 1, Comparative example 1 and FIG. 6, it can be seen that, in a case of a same luminescent center (europium Eu), the fluorescence intensity of the europium complex is lower than europium oxide nanosheet $Y_{19}(Eu)O$-TTA, i.e. rare earth ($Y_{19}(Eu)$) oxide nanosheet composite modified by organic ligand (2-thenoyltrifluoroacetone).

After testing, the fluorescence intensities of the rare earth oxide nanosheet composites obtained by Examples 2-6 was basically consistent with that of Example 1.

Test Two: Colour Purity

Test objects: the OLED luminescent film of Example 6 was used as test sample 6; zinc complex coordinated with 1,10-phenanthroline ($Zn(phen)_3$) was used as comparative sample 2.

Figure 7:
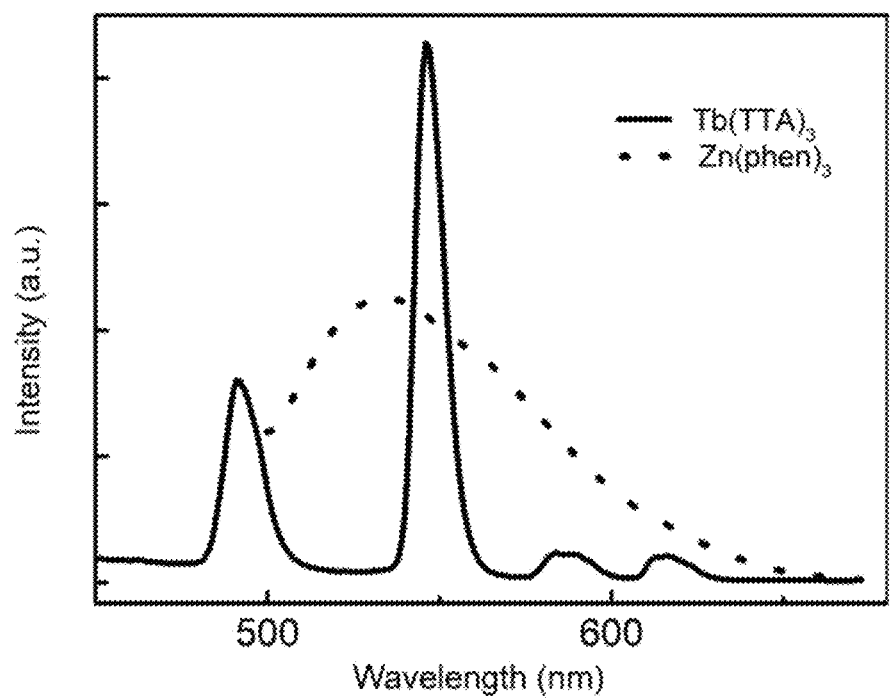
FIG. 7 is the fluorescence spectrum comparison diagram of test sample 6 in the present application and comparative sample 2.

Test method: the fluorescence properties of zinc complex coordinated with 1,10-phenanthroline ($Zn(phen)_3$) and ($Tb(TTA)_3$) of Example 6 were separately tested by using the fluorescence spectrophotometer, and recorded in FIG. 7.

In combination with test sample 6, comparative sample 2 and FIG. 7, it can be seen that, rare earth oxide nanosheet ($Tb(TTA)_3$) with central ion luminescence had higher colour purity (a half peak width was less than 10 nm), while a half wave width of zinc complex ($Zn(phen)_3$) is far greater than the half peak width of test sample 6, resulting in lower colour purity. Because organic fluorescent materials are limited by the spin selection rule, its maximum quantum efficiency is not exceed 25%. In contrast, the luminescence of the rare earth complexes originates from energy transfer of singlet excitons to triplet states through intersystem crossing and then to central ions. This luminescence mechanism can make effective use of singlet excitons and triplet excitons generated during electroluminescence, and finally it leads to the radiation transition of rare earth ions. It can be seen that the rare earth nanosheet modified by the organic ligand is the same as the rare earth complex, and the theoretical upper limit of internal quantum efficiency can reach 100%.

After testing, the colour purity of the rare earth oxide nanosheet composites obtained in Examples 1-5 are basically consistent with that in Example 6.

Test Three: Service Life

Test objects: the OLED luminescent film of Example 1 was used as test sample 1; the OLED luminescent film of Comparative example 1 was used as comparative test sample 1;

Test method: Example 1 and Comparative example 1 were placed under an ultraviolet lamp for 5 months, and then luminescent performance of Example 1 and comparative Example 1 were tested.

Figure 8A:
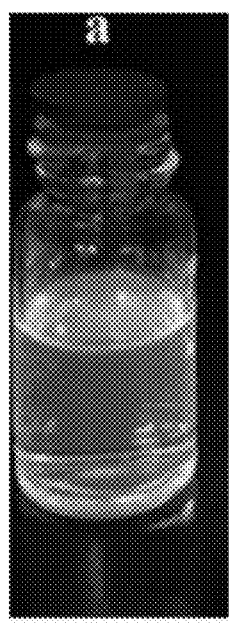
Figure 8B:
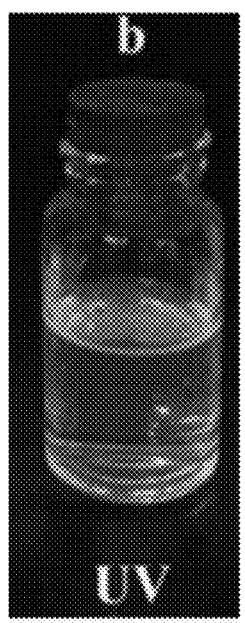

In combination with Example 1, Comparative example 1 and FIGS. 8A-8B, it can be seen that, after the europium oxide nanosheet sol solution (FIG. 8A) and the europium complex solution (FIG. 8B), which had the same luminescent performance, were placed under the ultraviolet lamp for 5 months, the europium oxide nanosheet sol solution still keep the excellent luminescent performance, while the luminescent performance of the europium complex solution is obviously weaker than that of nanosheet. It shows that europium oxide nanosheet is not prone to aggregate and has excellent photobleaching resistance, so it have better luminescent life.

After testing, the service life of the rare earth nanosheet composites obtained in Examples 2-6 is basically consistent with that in Example 1.

The specific examples are only used to illustrate the present application and not used to limit the protection scope of the present application. After reading the specification, those skilled in the art can make modifications to present application without creative contribution as needed, However, it is protected by the patent law as long as it is within the scope of the claims in the present application.

What is claimed is:

1. A preparation method of a rare earth oxide nanosheet composite modified by an organic ligand, comprising steps as follows: adding the organic ligand into a rare earth oxide nanosheet sol for ultrasonic coordination, and ultrasonically processing at 40-60% of a rated power for 20-40 min to obtain the rare earth oxide nanosheet composite modified by the organic ligand, wherein a mole ratio of the rare earth oxide nanosheet sol to the organic ligand is 1:3 to 1:9.

2. The preparation method of the rare earth oxide nanosheet composite modified by the organic ligand according to claim 1, wherein the organic ligand is one selected from a group consisting of potassium (3,5-dimethylpyrazolyl) borate, α-thiophene acetylacetone and 2-thenoyltrifluoroacetone.

3. The preparation method of the rare earth oxide nanosheet composite modified by the organic ligand according to claim 1, wherein a preparation method of the rare earth oxide nanosheet sol comprises:

1) grinding a rare earth oxide and bromide, and calcining at a temperature of 700-1000° C. for 12-24 h to obtain a rare earth bromide;

2) conducting microwave intercalation treatment to the rare earth bromide by using an intercalation agent to obtain a rare earth oxide intercalation intermediate;

3) dispersing the rare earth oxide intercalation intermediate into an organic solvent for stripping to obtain a rare earth oxide nanosheet; and 4) centrifugally separating the rare earth oxide intercalation intermediate after being stripped, and taking supernatant to obtain a rare earth nanosheet sol.

4. The preparation method of the rare earth oxide nanosheet composite modified by the organic ligand according to claim 3, wherein, in step 1), the bromide is at least one of potassium bromide or ammonium bromide.

5. The preparation method of the rare earth oxide nanosheet composite modified by the organic ligand according to claim 3, wherein the rare earth oxide comprises at least two selected from a group consisting of yttrium metal oxide, europium metal oxide, terbium metal oxide, cerium metal oxide and gadolinium metal oxide.

6. The preparation method of the rare earth oxide nanosheet composite modified by the organic ligand according to claim 5, wherein, in step 1), a mole ratio of the rare earth oxide to the bromide is 1:2 to 1:3.

7. The preparation method of the rare earth oxide nanosheet composite modified by the organic ligand according to claim 3, wherein, in step 1), the method for grinding is ball grinding.

8. The preparation method of the rare earth oxide nanosheet composite modified by the organic ligand according to claim 3, wherein, in step 2), the microwave intercalation treatment comprises dispersing the bromide in the organic solvent, adding the intercalation agent, and performing microwave heating at a power of 700-800 w for 2-5 min, cooling under stirring, filtering, washing with deionized water, and drying for 12-24 h at a temperature of 60-100° C. to obtain the rare earth oxide intercalation intermediate.

9. The preparation method of the rare earth oxide nanosheet composite modified by the organic ligand according to claim 8, wherein the intercalation agent comprises at least one of sodium benzoate or sodium dodecyl benzene sulfonate.

10. The preparation method of the rare earth oxide nanosheet composite modified by the organic ligand according to claim 8, wherein the organic solvent is one or more selected from a group consisting of 1-butanol, ethanol and water.

11. The preparation method of the rare earth oxide nanosheet composite modified by the organic ligand according to claim 3, wherein, in step 3), the method of stripping comprises at least one of ultrasonically stripping or ball-mill stripping.

12. The preparation method of the rare earth oxide nanosheet composite modified by the organic ligand according to claim 11, wherein, in step 3), ultrasonic power used in the ultrasonically stripping method is 1000-1500 w, and ultrasonic time is 20-40 min.

* * * * *